US012782476B2

(12) United States Patent
Budker et al.

(10) Patent No.: US 12,782,476 B2
(45) Date of Patent: Nov. 3, 2026

(54) APPARATUS AND METHOD FOR INVESTIGATING A SAMPLE BY USING NUCLEAR MAGNETIC RESONANCE AND A MAGNETORESISTANCE SENSOR

(71) Applicant: Johannes Gutenberg-Universität Mainz, Mainz (DE)

(72) Inventors: Dmitry Budker, Mainz (DE); Yinan Hu, Mainz (DE); Román Picazo-Frutos, Mainz (DE); Arne Wickenbrock, Mainz (DE); Lykourgos Bougas, Mainz (DE); James Eills, Bristol (GB); Danila Barskiy, Mainz (DE)

(73) Assignee: Johannes Gutenberg-Universität Mainz, Mainz (DE)

( * ) Notice: Subject to any disclaimer, the term of this patent is extended or adjusted under 35 U.S.C. 154(b) by 150 days.

(21) Appl. No.: 18/866,911

(22) PCT Filed: Jan. 13, 2023

(86) PCT No.: PCT/EP2023/050704
§ 371 (c)(1),
(2) Date: Nov. 18, 2024

(87) PCT Pub. No.: WO2023/222258
PCT Pub. Date: Nov. 23, 2023

(65) Prior Publication Data

US 2025/0244420 A1 Jul. 31, 2025

(30) Foreign Application Priority Data

May 19, 2022 (EP) .................................... 22174207

(51) Int. Cl.
*G01R 33/32* (2006.01)
*G01N 24/08* (2006.01)
(Continued)

(52) U.S. Cl.
CPC ........... *G01R 33/323* (2013.01); *G01N 24/08* (2013.01); *G01R 33/282* (2013.01); *G01R 33/445* (2013.01)

(58) Field of Classification Search
CPC .. G01R 33/323; G01R 33/282; G01R 33/445; G01R 33/307; G01R 33/421; G01R 33/62; G01R 33/46; G01N 24/08
See application file for complete search history.

(56) References Cited

U.S. PATENT DOCUMENTS

| | | | | |
|---|---|---|---|---|
| 7,573,264 | B2 * | 8/2009 | Xu | G01R 33/26 324/318 |
| 11,204,407 | B2 | 12/2021 | Punzo et al. | |
| 2004/0027125 | A1 * | 2/2004 | Clarke | G01R 33/0356 324/318 |

OTHER PUBLICATIONS

International Search Report and Written Opinion issued in corresponding International Application No. PCT/EP2023/050704, mailed Mar. 27, 2023.

(Continued)

*Primary Examiner* — G.M. A Hyder
(74) *Attorney, Agent, or Firm* — Shook, Hardy & Bacon L.L.P.

(57) ABSTRACT

The present invention relates to an apparatus (100) and method for investigating a sample by using nuclear magnetic resonance, particularly zero- to ultra-low-field nuclear magnetic resonance, the apparatus (100) comprising: —a magnetically shielded chamber (20) for magnetically shielding the sample from external static magnetic fields; —magnetic field pulse generation means (30) arranged in the magnetically shielded chamber (20) and configured to manipulate nuclear spins present in the sample, thereby causing the sample to produce a magnetic signal; and—at least one magnetoresistive sensor (40) comprising a ferromagnetic material, wherein the at least one magnetoresistive sensor (Continued)

(40) is arranged in the magnetically shielded chamber (20) and configured to detect the magnetic signal produced by the sample.

15 Claims, 2 Drawing Sheets

(51) Int. Cl.
*G01R 33/28* (2006.01)
*G01R 33/44* (2006.01)

(56) References Cited

OTHER PUBLICATIONS

F. Verpillat et al., "Detection of nuclear magnetic resonance with an anisotropic magnetoresistive sensor", Oct. 11, 2007, arXiv:0710.2365 [physics.chem-ph].

Tobias F. Sjolander et al., "Transition-Selective Pulses in Zero-Field Nuclear Magnetic Resonance", The Journal of Physical Chemistry A, vol. 120, No. 25, 2016, pp. 4343-4348, DOI: 10.1021/acs.jpca.6b04017.

Min Jiang et al., "Experimental benchmarking of quantum control in zero-field nuclear magnetic resonance", Science Advances, vol. 4, No. 6, Jun. 15, 2018, Retrieved from the Internet: <URL: https://www.science.org/doi/epdf/10.1126/sciadv.aar6327>.

Min Jiang et al., "Zero- to ultralow-field nuclear magnetic resonance and its applications", Nov. 30, 2020; arXiv:2011.14945 v1 [quant-ph].

Min Jiang et al., "Magnetic Gradiometer for the Detection of Zero- to Ultralow-Field Nuclear Magnetic Resonance", arXiv:1808.02743v1 [physics.atom-ph].

Simon B. Duckett and Ryan E. Mewis, "Application of Parahydrogen Induced Polarization Techniques in NMR Spectroscopy and Imaging", Accounts of Chemical Research, 2012, vol. 45, No. 8, pp. 1247-1257.

International Preliminary Report on Patentability issued in corresponding International Application No. PCT/EP2023/050704, mailed Nov. 28, 2024.

* cited by examiner

APPARATUS AND METHOD FOR INVESTIGATING A SAMPLE BY USING NUCLEAR MAGNETIC RESONANCE AND A MAGNETORESISTANCE SENSOR

The present invention relates to an apparatus and a method for investigating a sample by using nuclear magnetic resonance.

Nuclear magnetic resonance (NMR) spectroscopy is a powerful technique employed in many areas of modern science and industry. The conventional NMR spectroscopy is a spectroscopic technique to observe local magnetic fields around atomic nuclei. A sample or an object is placed in an externally applied strong static magnetic field (several to dozen tesla), which provides a quantization axis around which nuclear spins precess. The NMR signal is produced by excitation of nuclear spins present in the sample with an oscillating weaker magnetic field at radio-frequency (typically in the range of MHz) into nuclear magnetic resonance, which is detected with an inductive detector (inductive pickup coil).

Conventional NMR usually involves the following sequential steps:

- the orientation (polarization) of the magnetic nuclear spins in an applied strong constant magnetic field (most often provided by a superconducting magnet);
- the perturbation of this orientation of the nuclear spins (also referred to as excitation of the spins) by a weak oscillating magnetic field, usually referred to as a radio-frequency (RF) pulse or pulse sequence; and
- the detection and analysis of the magnetic fields produced by the nuclei of the sample as a result of this perturbation (inductive detection of the spin precession, also referred to as Larmor precession).

Accordingly, nuclear magnetic resonance (NMR) experiments are conventionally performed in large magnetic fields in order to increase resolution (particularly chemical shift resolution) and to maximize the detection signal via higher nuclear spin polarization and improved inductive detection sensitivity.

However, while a seemingly indispensable element of NMR is a strong (>1 tesla) magnetic field, recent progress in physics and chemistry has enabled detection of NMR signals at ultra-low and zero magnetic fields. This so-called zero- to ultralow-field (ZULF) NMR is an alternative magnetic resonance modality where measurements are performed in the absence of an applied static magnetic field. Due to the absence of an applied static magnetic field, ZULF-NMR is mainly based on internal spin interactions of the sample to be investigated.

ZULF-NMR is an alternative nuclear magnetic resonance modality that does not rely on the presence of a strong magnetic field for polarizing the nuclei, encoding the chemical or spatial information, or detection of nuclear magnetization. While having numerous advantages (e.g., the ability to make measurements within metal reactors), and being complementary to the traditional high-field NMR, the ZULF-NMR technique is generally inferior in its sensitivity necessitating the use of relatively large, concentrated, or isotopically labelled samples. Moreover, ZULF-NMR requires state-of-the-art magnetometry for the detection, i.e. most sensitive magnetic field sensors or magnetometers (such as atomic magnetometers or SQUIDs) as detectors.

It is an object of the present invention to provide an improved apparatus and method for investigating a sample by using NMR, particularly by using ZULF-NMR. This object is solved according to the invention by the features of the independent claims. Preferred embodiments of the invention are subject of the dependent claims.

According to an aspect of the present invention, an apparatus for investigating a sample by using nuclear magnetic resonance, particularly zero- to ultra-low-field nuclear magnetic resonance, is provided. The apparatus comprises:

- a magnetically shielded chamber for magnetically shielding the sample from external static magnetic fields;
- magnetic field pulse generation means arranged in the magnetically shielded chamber and configured to manipulate nuclear spins present in the sample, thereby causing the sample to produce a magnetic signal; and
- at least one magnetoresistive sensor comprising a ferromagnetic material, wherein the at least one magnetoresistive sensor is arranged in the magnetically shielded chamber and configured to detect the magnetic signal produced by the sample.

The magnetically shielded chamber, which may also be referred to as "magnetically-shielded enclosure", is a chamber or enclosure that is surrounded by a magnetic shield. The magnetically shielded chamber serves for housing the sample (or object) to be investigated during investigation. The magnetically shielded chamber may be made from a material (in particular a high permeability and electrically conductive material such as "Mu-Metal") which shields an external magnetic field, for example, by diverting the magnetic flux and drawing the magnetic field lines into the shielding material. In particular, the magnetically shielded chamber is configured to provide a zero- to ultralow-field region (ZULF-region). In other words, the magnetically shielded chamber is configured to magnetically shield the sample from external static magnetic fields such that the sample is in a ZULF-region.

Within the present invention, a ZULF-region is a region which is not or almost not affected by an external static magnetic field. In particular, the expressions "substantially free from an external static magnetic field" and "not or almost not affected by an external static magnetic field" relate to a static magnetic field below the earth's magnetic field and particularly below 1 μT. Thus, in other words, the magnetically shielded chamber is configured to provide an environment or region for investigating the object in a static magnetic field which is below the earth's magnetic field and particularly below 1 μT (ZULF region).

In particular, the magnetically shielded chamber is configured to shield the sample from external static magnetic fields (i.e. magnetic fields that are constant over time) when the sample is placed within the chamber for being investigated. In other words, the magnetically shielded chamber, in which the sample is placed when being investigated, provides a magnetically shielded environment or region, i.e., an environment or region which is substantially free from an external static magnetic field.

In addition to the magnetically shielded chamber, compensating coils may be used to provide the ZULF-region. Such coils are also useful to make the magnetic field more homogeneous.

Thus, according to the present invention, the sample is investigated by means of nuclear magnetic resonance in a magnetically shielded configuration, preferably in the absence of an external static or constant magnetic field.

The magnetic field pulse generation means are configured to manipulate (particularly excite) spins. Accordingly, the magnetic field pulse generation means may also be referred to as "spin-manipulation means". The magnetic field pulse generation means may comprise (pulsing) NMR coils, particularly Helmholtz coils. For example, the magnetic field pulse generation means may comprise at least two and preferably three pairs of Helmholtz coils. A pair of Helmholtz coils consists of two identical circular magnetic coils that are placed symmetrically along a common axis. The coils may be arranged such that the magnetic field can be directed in two or three orthogonal directions. In particular, the common axis of a first pair of Helmholtz coils may be oriented along an x-axis, the common axis of a second pair of Helmholtz coils may be oriented along a y-axis, and the common axis of a third pair of Helmholtz coils may be oriented along a z-axis, wherein the x-axis, y-axis and z-axis are orthogonal to each other. Accordingly, the magnetic field pulse generation means are configured to generate a magnetic field and/or magnetic field pulses, preferably in three dimensions. More specifically, the magnetic field pulse generation means (or spin-manipulation means) may, for example, be configured to apply T pulses and/or continuous wave excitation and/or to perform adiabatic fast passage and/or adiabatic following to flip orientation of hyperpolarized nuclei.

A "magnetoresistive sensor" is a sensor for detecting a magnetic signal based on at least one magnetoresistance effect. In particular, the magnetoresistive sensor may be based on at least one of the following: the anisotropic magnetoresistance (AMR), the giant magnetoresistance (GMR), the tunnel magnetoresistance (TMR), the colossal magnetoresistance (CMR), and/or the extraordinary magnetoresistance (EMR). Thus, the magnetoresistive sensor may for example be an anisotropic magnetoresistive sensor, a giant magnetoresistive sensor or a tunnel junction magnetoresistive sensor. Magnetoresistive effects and corresponding sensors are well known and therefore not further described within the present invention. The at least one magnetoresistive sensor may be arranged in a magnetically shielded detection region of the magnetically shielded chamber. It is configured to detect the magnetic signal produced by the sample, particularly a projection of the magnetic signal along a sensitive axis of the magnetoresistive sensor.

The magnetoresistive sensor used according to the present invention comprises a ferromagnetic material, i.e., the magnetoresistive sensor is at least partially ferromagnetic. This feature makes it a non-obvious choice to use such a sensor with ZULF NMR. However, while in conventional ZULF-NMR, sensors without a magnetizable material, such as atomic-vapor-based optically pumped magnetometers (OPM), superconducting magnetometers (SQUIDs), NV-diamond magnetometers, etc., are used for detecting an NMR signal in the ZULF region, the present invention suggests using at least one magnetoresistive sensor with a ferromagnetic material for detecting a magnetic signal produced by the sample within the magnetically shielded chamber. This is because within the present invention, it has been surprisingly found that (in-situ) NMR detection at zero- to ultralow-magnetic fields is possible and advantageous even with (slightly) magnetized sensors.

For example, magnetoresistive sensors have a high dynamic range (zero field to almost earth's field) and do not cause high temperatures. This is relevant, for example, for biomedical applications or chemical-reaction monitoring at zero field, which is highly temperature dependent. Moreover, the present invention provides the ability to obtain spectroscopic signatures of chemicals (spectroscopy) using magnetoresistive sensors based on thermal polarization and/or hyperpolarization. Specifically, spectroscopy includes measurement of J-couplings and other forms of nuclear spin-spin interactions (reporting on chemical parameters of the sample), including pure J-spectroscopy at ultralow fields, where spin-spin interactions dominate over other form of interaction, in the high-field regime, where the Zeenan interactions dominate, as well as in the intermediate regime, where the spectra contain maximum chemical information. In particular, the key advantages of magnetoresistive sensors include high bandwidth, high dynamic range, compact size, small sample-sensor distance, all-solid-state embodiment, low cost, as well as established mass-production techniques.

Further major advantages of magnetoresistive sensors are that they can operate at room temperature (and physiological temperatures), and thus, can be brought into close contact with the sample (including inside of a person). In particular, magnetoresistive sensors operate in a broad range of temperatures, from cryogenic to over 125° C., enabling measurements of NMR spectra with sensors at different temperature conditions. Currently, ZULF NMR spectra are typically detected with optically pumped magnetometers (OPM). These are usually more than several centimeters in size, incorporate an atomic vapor cell that needs to be heated to 150 to 200° C., and require thermal isolation from the sample. Magnetoresistive sensors, on the other hand, are free from these issues. Moreover, a major advantage of magnetoresistive sensors is a greatly reduced dead time. In detecting ZULF NMR with OPMs, dead time presents a significant challenge. In essence, the excitation NMR pulse perturbs the magnetic sensor that becomes insensitive for some time, the dead time, before the excitation can occur. Thus, the signal produced by the sample during the dead time is not detected. Within the present invention, by using custom designed electronics, the magnetoresistive sensors have been proven to reduce this time significantly, potentially reaching zero. This leads to significant advantages. For example, the signal intensity is greatly increased since the full length of the NMR signal can be acquired. An immediate consequence of this is that the number of averages needed can be reduced. Moreover, if the dead time is reduced to substantially zero and a sample mixture that contains many chemical compounds is measured, all of them would show up in phase in the frequency domain. This is an important point because peaks in phase are the standard convention in high-field NMR. Using magnetoresistance sensors thus makes the peaks elucidation much easier. Another important consequence of having a very short dead time is the ability to detect signals arising from extremely fast-decaying samples (such as a blood sample which may decay even in less than 1 ms).

The apparatus may further comprise a sample holder for positioning and holding the sample at a measuring position within the magnetically shielded chamber. The sample holder for positioning and holding the sample at a measuring position (i.e. a position of the sample when being investigated) within the magnetically shielded chamber may comprise a tube (made, for example, from glass and/or titanium) in which the sample can be placed and held. The sample holder may be movable to bring the sample into and out of the magnetically shielded chamber, i.e., to bring the sample to the measuring position and out of it. Alternatively, the sample holder may be a holder which is fixed at the measuring position. In this case, the sample has to be placed into the sample holder by other means. Preferably, the measuring position is in the center of the magnetically shielded chamber.

The apparatus may comprise a spin-manipulation unit which comprises the spin-manipulation means (e.g. one or more magnetic coils) as already described above. Further, the spin-manipulation unit may comprise additional electronic components for controlling the spin manipulation means. For example, the spin-manipulation unit may be arranged and/or configured to apply radiofrequency pulses affecting the sample when placed at the measuring position within the magnetically shielded chamber. The spin-manipulation unit may be arranged, at least in parts, within the magnetically shielded chamber, preferably close to and/or surrounding the measuring position, and thus close to and/or surrounding the sample holder and/or the sample when placed in the measuring position. Preferably, a system of magnetic coils is arranged inside the magnetically shielded chamber, while other components of the spin-manipulation unit (for example, electronic components for controlling spin manipulation means) are arranged outside the magnetically shielded chamber.

The apparatus may further comprise a flux concentrator for collecting magnetic flux emitted by the sample and for concentrating the collected magnetic flux in the magnetoresistive sensor (particularly a detection region of the magnetoresistive sensor). In particular, the at least one magnetoresistive sensor may comprise or be equipped with a flux concentrator, i.e., a device (particularly a passive soft-ferromagnetic device) that is configured to collect magnetic flux (e.g. emitted from the sample) and to concentrate the magnetic flux in the sensor (particularly a detection region of the magnetoresistive sensor). By means of such a flux concentrator the detection sensitivity can advantageously be improved, which is of particular importance in connection with ZULF NMR.

In a preferred embodiment, the apparatus comprises demagnetization means which are configured to demagnetize the at least one magnetoresistive sensor (and particularly also a flux concentrator being encompassed by and/or coupled with the magnetoresistive sensor). The demagnetization means may comprise or be second magnetic field pulse generation means. In one embodiment, the second magnetic field pulse generation means may differ from the above-described magnetic field pulse generation means that are configured to manipulate nuclear spins of the sample (herein also referred to as "first magnetic field generation means or "spin-manipulation means"). Preferably, the demagnetization means and particularly the second magnetic field pulse generation means being configured to demagnetize the at least one magnetoresistive sensor may be identical with the spin-manipulation means and particularly with the first magnetic field pulse generation means (i.e., the magnetic field pulse generation means configured to manipulate nuclear spins present in the sample). In other words, the demagnetizing means may be identical with the spin-manipulation means. In case that the spin-manipulation means and the demagnetization means are identical, they may be referred to as "spin-manipulation and demagnetization means". Accordingly, the magnetic field pulse generation means may be configured to manipulate spins present in the sample and, additionally, to demagnetize the at least one magnetoresistive sensor.

Particularly by applying a demagnetization or degaussing procedure to the magnetoresistive sensor, an NMR detection at zero- to ultralow magnetic fields (i.e., an NMR detection in the ZULF region) is possible even with magnetoresistive sensors that are at least partially ferromagnetic and that therefore might be (slightly) magnetized.

In a further preferred embodiment, the apparatus comprises a measurement sequencing unit for controlling the magnetic field pulse generation means and the demagnetization means, wherein the measurement sequencing unit is configured to carry out a measurement sequence including a demagnetization sequence for demagnetizing the at least one magnetoresistive sensor, wherein the demagnetization sequence preferably comprises the generation and/or application of a decaying sinusoidal wave magnetic field. In particular, the measurement sequence further includes a measurement pulse sequence for manipulating nuclear spins present in the sample. The measurement sequencing unit may particularly comprise or be a gradient driver module.

In the demagnetization procedure, the magnetic field pulse generation means (particularly the magnetic pulsing NMR coils themselves) may be used for degaussing. Preferably, for the demagnetization of the magnetoresistive sensor, a decaying sinusoidal wave magnetic field of a frequency in the range of tens of hertz (typically 50 Hz) with a total duration of 20 s to minutes, and a characteristic decay time of about 5 ray be used. The efficiency of the procedure was found to depend only mildly on the exact values of these parameters, as long as they are in this general range. Although the times provided above regarding the degaussing procedure have been proved successfully by the inventors, it is to be understood that other, particularly shorter times, may be possible: For example, it may be possible to completely demagnetize the sensor in e.g. 3 s (or less), provided an appropriate frequency of the decaying sinusoidal.

The experimental cycle may just include the demagnetization sequence prior to the normal measurement cycle (i.e. a measurement cycle conventionally used for NMR measurements, also referred to herein as "NMR measurement cycle"). Because the demagnetization procedure is finished prior to the measurement cycle, the former does not adversely influence the signals. On the other hand, the benefit of the demagnetization is that the possible influence of sensor magnetization on the signals is greatly reduced or removed, ensuring that the sample is in ZULF conditions. When carrying out the demagnetization sequence prior to the normal measurement cycle, the duration of the degaussing procedure may be preferably reduced to be in the millisecond-timescale.

Alternatively, the measurement sequence may comprise a specialized "spin-locking" pulse sequences, in which the demagnetization of the magnetoresistive sensor can be incorporated within the measurement pulse sequence itself. Here, the sample can be "locked" in a state that is not affected by the demagnetization fields while the latter are applied. This results in a more efficient demagnetization and improved duty cycle.

In a further preferred embodiment, the apparatus further comprises a sensor holder for holding the at least one magnetoresistive sensor, wherein the sensor holder is arranged in the magnetically shielded chamber and further serves as a support for the magnetic field pulse generation means. In other words, the at least one magnetoresistive sensor is arranged in the holder, particularly in a corresponding recess of the holder. In particular, the sensor holder may be fabricated by additive fabrication means. In other words, the sensor holder may be 3D-printed. In particular, the sensor holder may serve as a support for the Helmholtz coils.

In a further preferred embodiment, the apparatus further comprises spin hyperpolarization means for hyperpolarizing nuclear spins present in the sample. Hyperpolarization can be accomplished, for example, by placing the sample in a strong external magnet (magnetic field) with subsequent shuttling of the polarized sample to be investigated into the ZULF region. Alternatively, hyperpolarization may be achieved by a variety of other means, including but not limited to the following examples: dynamic nuclear polarization (DNP), dissolution DNP (dDNP), photochemically induced DNP (CI-DNP), as well as spin-exchange optical pumping (SEOP).

Accordingly, the hyperpolarization means may comprise one or more of the following: a hyperpolarization magnet or a magnetic field generation unit, a dynamic nuclear polarization (DNP) unit, and a light source.

In a further preferred embodiment, the spin hyperpolarization means are configured to carry outa parahydrogen induced polarization. Thus, the hyperpolarization means may be referred to as parahydrogen hyperpolarization means. In particular, the hyperpolarization means comprise a source of hydrogen gas in the para-form. The parahydrogen induced polarization (PHIP) may be a hydrogenative PHIP or a non-hydrogenative PHIP. Preferably, a "signal amplification through reversible exchange" (SABRE) is used as a non-hydrogenative PHIP. SABRE is a technique to generate strong non-thermal nuclear spin polarization (spin hyperpolarization) and to enhance the NMR signal intensities of a sample or substrate. SABRE turns typically weak magnetic resonance responses into strong signals making previously impractical measurements possible. Generally, in SABRE, a suitable transition metal catalyst dissolved in an organic solvent is used, which forms a complex with $H_2$ and a substrate. In a "reversible exchange stage", non-polarized $H_2$ is replaced by polarized para-$H_2$ (p-$H_2$, i.e., the $H_2$ molecule in its singlet nuclear spin state), which transfers its polarization to the liganded substrate. Hyperpolarizing by using SABRE particularly involves bringing distinct molecules into contact with parahydrogen using a suitable chemical catalyst to facilitate the reversible chemical exchange. Particularly by applying suitable magnetic fields (stationary or oscillatory) to the chemical system, it is possible to generate a hyperpolarization. A general description of SABRE can be found, e.g., in Simon B. Duckett and Ryan E. Mewis: "Application of Parahydrogen Induced Polarization Techniques in NMR Spectroscopy and Imaging", Acc. Chem. Res. 2012, 45, 8, pages 1247-1257 (the entire content of which is incorporated herein by reference).

The major difference between hydrogenative PHIP and SABRE is that in SABRE, the chemical identity of the molecule being hyperpolarized is preserved. Further, "PHIP-X" (with X standing for "exchange") may be used as a hydrogenative PHIP, and "SABRE Rai" may be used as a non-hydrogenative PHIP. Both "PHIP-X" and "SABRE Relay" use chemical exchange to transfer hyperpolarization to a wide range of molecules that do not directly participate in PHIP. This is advantageous as it allows to hyperpolarize a broad range of compounds that can be analyzed with NMR. As for ZULF NMR, it allows NMR spectroscopy and imaging without bulky, heavy and expensive magnets. The result is that a combination of hyperpolarization and ZULF NMR with magnetoresistive sensing enables NMR/MRI (magnetoresistive imaging) modalities that are portable, compact, low-cost, and yielding information complementary to traditional high-field NMR/MRI setups.

In a further preferred embodiment, the magnetically shielded chamber is constituted by a first magnetic shield and a second magnet shield, wherein the second magnetic shield comprises a ferrite layer which is arranged between the first magnetic shield and the magnetoresistive sensor. The first magnetic shield preferably comprises or is made from Mu-Metal. The second magnetic shield and/or the ferrite layer advantageously serves for reducing or avoiding Johnson noise. For example, the first magnetic shield is a four-layer Mu-metal magnetic shield, and the second magnetic shield is a one-layer ferrite magnetic shield. Thereby, a ZULF region can be provided within the magnetically shielded chamber.

In a further preferred embodiment, the apparatus comprises a shuttling tube for shuttling the sample into the magnetically shielded chamber. Preferably, the apparatus also comprises a solenoid which is wrapped around the shuttling tube. By means of the solenoid wrapped around the shuttling tube, a guiding magnetic field can be applied to shuttle the sample into the magnetically shielded chamber. The solenoid is particularly configured to penetrate the shielding enclosure (i.e. the magnetically shielded chamber), and is thus also referred to as "piercing solenoid".

In a further preferred embodiment, the apparatus comprises a computer-based data acquisition system which is coupled to the at least one magnetoresistive sensor and configured to record a detection signal from the at least one magnetoresistive sensor.

A further aspect of the present invention relates to a method for investigating a sample by using nuclear magnetic resonance, particularly zero- to ultra-low-field nuclear magnetic resonance, the method comprising:

magnetically shielding the sample from external static magnetic fields by placing the sample into a magnetically shielded chamber;

manipulating, particularly exciting, nuclear spins that are present in the sample by using magnetic field pulse generation means arranged in the magnetically shielded chamber, thereby causing the sample to produce a magnetic signal; and detecting the magnetic signal produced by the sample by using at least one magnetoresistive sensor which is arranged in the magnetically shielded chamber and which comprises a ferromagnetic material.

In particular, the magnetically shielding of the sample is done such that the sample is in a ZULF region when being investigated.

In a preferred embodiment, the at least one magnetoresistive sensor is demagnetized before detecting the magnetic signal produced by the sample. In other words, a demagnetizing or degaussing procedure is carried out in order to demagnetize the at least one magnetoresistive sensor. In particular, a measurement sequence including a demagnetization sequence for demagnetizing the at least one magnetoresistive sensor is carried out, particularly by means of a measurement sequencing unit. In other words, a demagnetizing or degaussing cycle is applied to the magnetoresistance sensor.

In a further preferred embodiment, the magnetoresistive sensor is demagnetized in that a decaying sinusoidal wave magnetic field is generated in the vicinity of the magnetoresistive sensor by using demagnetization means. As already mentioned above, the decaying sinusoidal wave magnetic field preferably has a frequency in the range of tens of hertz (typically 50 Hz) with a total duration of 20 s to minutes, and with a characteristic decay time of about 5 s. In particular, the measurement sequencing unit is configured to control the magnetic field generation means of a spin-manipulation unit and/or a demagnetization unit (particularly a spin-manipulation-and-demagnetization unit). The experimental cycle may just include the demagnetization sequence prior to a normal measurement cycle. The normal measurement cycle may, for example, include the application of $\pi$ pulses and/or continuous wave excitation and/or the performance of adiabatic fast passage and/or adiabatic following to flip orientation.

Because the demagnetization procedure is over prior to the measurement cycle, the former does not adversely influence the signals. On the other hand, the benefit of the demagnetization is that the possible influence of sensor magnetization on the signals is greatly reduced or removed, ensuring that the sample is in ZULF conditions.

Alternatively, a specialized "spin-locking" pulse sequence may be applied, in which the demagnetization of the magnetoresistive sensor is incorporated within the measurement pulse sequence itself. Here, the sample can be "locked" in a state that is not affected by the demagnetization fields while the latter are applied. This results in a more efficient demagnetization and improved duty cycle.

In a further preferred embodiment, nuclear spins present in the sample are hyperpolarized before manipulating the spins.

In a further preferred embodiment, the hyperpolarization is carried out by using parahydrogen-induced polarization methods.

In a further preferred embodiment, the hyperpolarization, particularly a parahydrogen-induced hyperpolarization, of the nuclear spins present in the sample is carried out in-situ inside the magnetically shielded chamber and/or in-situ inside the sample. This advantageously enables a compact measurement setup and the possibility of performing in-situ measurements. Alternative or in addition to parahydrogen-induced hyperpolarization, an in-situ ambient-temperature (and/or chemically-based) polarization of nuclear spins may be carried out.

For the above mentioned further independent aspect and in particular for preferred embodiments in this regard, the explanations given above or below concerning the embodiments of the first aspect also hold true. In particular, for one independent aspect of the present invention and for preferred embodiments in this regard, the explanations given above and below concerning the embodiments of the respective other aspects also hold true.

Individual embodiments for solving the problem are described by way of example below with reference to the figures. In this case, the individual embodiments described have in part features which are not absolutely necessary for implementing the claimed subject matter, but which provide desired properties in specific applications. In this regard embodiments which do not have all the features of the embodiments described below are also intended to be regarded as disclosed in a manner coming under the technical teaching described. Furthermore, in order to avoid unnecessary repetitions, specific features are mentioned only with regard to individual embodiments from among the embodiments described below. It is pointed out that the individual embodiments are therefore intended to be considered not only by themselves but also in a joint consideration. On the basis of this joint consideration the person skilled in the art will recognize that individual embodiments can also be modified by inclusion of individual or a plurality of features of other embodiments. It is pointed out that a systematic combination of the individual embodiments with individual or a plurality of features described with regard to other embodiments may be desirable and expedient and is therefore intended to be taken into account and also to be regarded as encompassed by the description.

BRIEF DESCRIPTION OF THE FIGURES

The above and other objects, features and advantages of the present invention will become more apparent upon reading of the following description of preferred embodiments and accompanying drawings. Other features and advantages of the subject-matter described herein will be apparent from the description and the drawings and from the claims. It should be understood that even though embodiments are separately described, single features and functionalities thereof may be combined without prejudice to additional embodiments. The present disclosure is illustrated by way of example and not limited by the accompanying figures.

Preferred embodiments of the present invention are exemplarily described regarding the following figures.

DETAILED DESCRIPTION OF THE FIGURES

The following description relates to exemplary embodiments of the present invention. Other embodiments of the invention are possible within the scope of the invention as defined by the appended claims. Throughout the figures, same reference signs are used for the same or similar elements.

Figure 1:
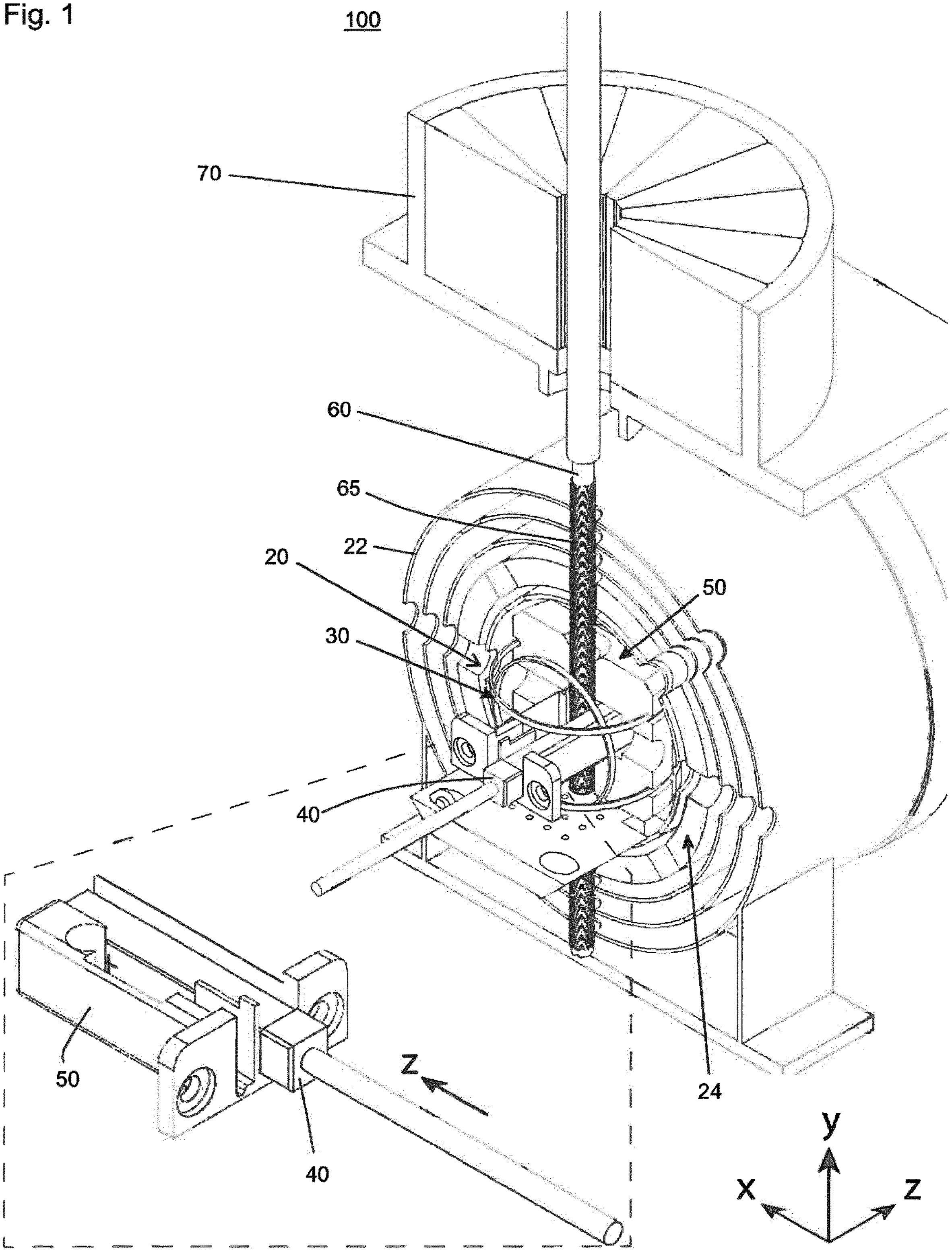
FIG. 1 shows a schematic representation of an apparatus according to a preferred embodiment of the present invention.

FIG. 1 shows a conceptional sketch of an apparatus 100 for investigating a sample (not explicitly shown in the figure) by using Zero- to Ultra-Low Field Nuclear Magnetic Resonance (ZULF NMR) according to an exemplified embodiment of the present invention.

The apparatus 100 comprises a magnetically shielded chamber 20 for magnetically shielding the sample from external static magnetic fields. The apparatus further comprises magnetic field pulse generation means 30 in form of Helmholtz coils which are arranged in the magnetically shielded chamber 20 such that a magnetic field and/or magnetic field pulses can be generated in three dimensions. The Helmholtz coils 30 are configured to manipulate nuclear spins present in the sample, thereby causing the sample to produce a magnetic signal. Moreover, the apparatus comprises a magnetoresistive sensor 40 including a ferromagnetic material. The magnetoresistive sensor 40 is arranged in the magnetically shielded chamber 20 and configured to detect the magnetic signal produced by the sample.

The Helmholtz coils 30 further serve as demagnetization means which are configured to demagnetize the at least one magnetoresistive sensor 40. By means of a measurement sequencing unit (not shown in FIG. 1) which controls the Helmholtz coils 30, a measurement sequence including a demagnetization or degaussing sequence for demagnetizing the magnetoresistive sensor 40 can be applied. This ensures that the sensor 40 is not magnetized during investigation of the sample. Accordingly, the measurements of the sample are not influenced by the ferromagnetic magnetoresistive sensor 40.

In order to provide a ZULF region within the magnetically shielded chamber 20, the magnetically shielded chamber 20 is constituted by a first magnetic shield 22, which comprises four layers of Mu-metal, and a second magnetic shield 24 which comprises a ferrite layer and which is arranged between the first magnetic shield 22 and the magnetoresistive sensor 40. The ferrite layer 24 particularly serves for reducing or avoiding Johnson noise.

The apparatus 100 further comprises a sensor holder 50 for holding the magnetoresistive sensor 40. The sensor holder 50 is arranged in the magnetically shielded chamber 20 and further serves as a support for the Helmholtz coils 30.

Moreover, the apparatus 100 comprises spin hyperpolarization means for hyperpolarizing nuclear spins present in the sample. In the example shown in FIG. 1, the spin hyperpolarization means comprise a strong pre-polarizing magnet 70. Before investigating the sample in the magnetically shielded chamber 20, the sample is placed in an external magnetic field (of about 2 tesla) provided by the pre-polarizing magnet. Subsequently, the polarized sample is shuttled into the ZULF region within the magnetically shielded chamber 20.

Moreover, the apparatus 100 comprises a shuttling tube 60 for shuttling the sample into the magnetically shielded chamber 20. A solenoid 65 is wrapped around the shuttling tube 60. By means of the solenoid 65 wrapped around the shuttling tube 60, a guiding magnetic field can be applied to shuttle the sample into the magnetically shielded chamber 20.

Thus, in other words, the ZULF NMR apparatus shown in FIG. 1 is based on a magnetoresistive sensor or magnetoresistive magnetometer 40 placed in a 3D printed holder 50. The printed holder 50 also serves as a support for the three orthogonal Helmholtz "pulse" coils 30. The magnetometer 40 and pulse coil assembly 30 are centered within a four-layer Mu-metal and one layer ferrite magnetic shield. The magnetoresistive magnetometer 40 is oriented such that the sensitive axis is parallel to a longitudinal axis of the magnetically shielded chamber 20 (z-axis in FIG. 1). The distance between the center of the sample and the center of the magnetometer cell is 9.5 mm. The analog outputs of the magnetoresistive magnetometer 40 can be read out, for example, by an analog input card at 5000 samples/s. The projection of the magnetic field along the z-axis can be recorded. Background magnetic fields can be controlled via a set of coils built into the magnetically shielded chamber 20. The currents in the Bx, By, and Bz coils can be provided by a DC current source. A "Gradient Driver Module" (measurement sequencing unit) can be used for the control of experimental timing (using TTL outputs) and magnetic field pulse generation (using the analog output of the gradient module). In principle, experimental control can be achieved using any system with digital timing and analog output capabilities.

Figure 2:
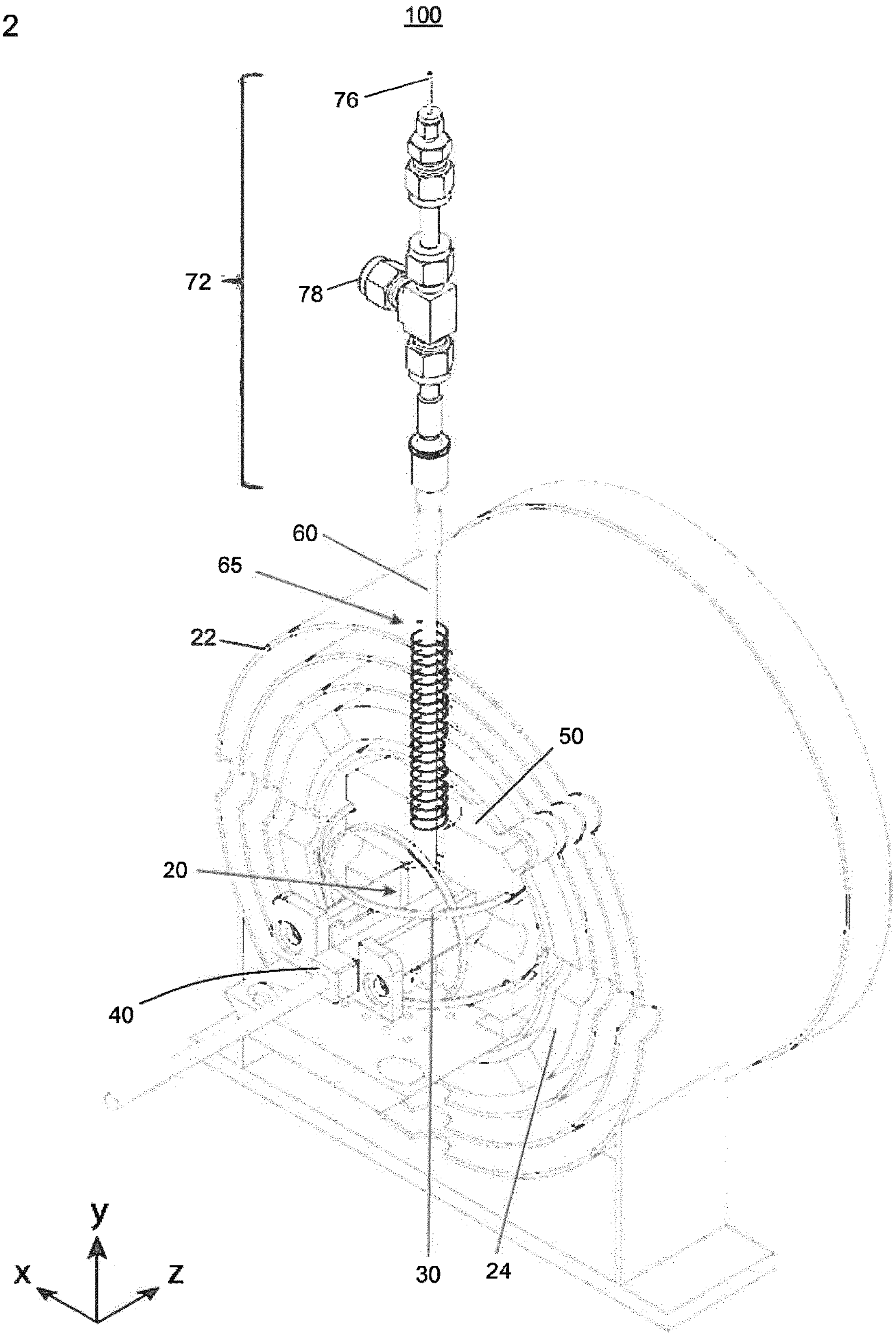
FIG. 2 shows a schematic representation of an apparatus according to another preferred embodiment of the present invention.

FIG. 2 shows a conceptional sketch of an apparatus 100 for investigating a sample (not explicitly shown in the figure) by using Zero- to Ultra-Low Field Nuclear Magnetic Resonance (ZULF NMR) according to another exemplified embodiment of the present invention. In this embodiment, the apparatus 100 comprises parahydrogen hyperpolarization means 72 instead of a pre-polarizing magnet as used in the embodiment of FIG. 1. As illustrated in FIG. 2, the parahydrogen hyperpolarization means 72, i.e., hyperpolarization means being configured to carry out parahydrogen induced polarization, comprise an inlet 76 and an outlet 78 for parahydrogen gas. Further, the parahydrogen hyperpolarization means 72 may comprise a source of hydrogen gas in the para-form (not shown in FIG. 2). Except for the hyperpolarization means, the other components of the apparatus 100 are similar to the components already described in connection with FIG. 1. For example, a solenoid 65 is used to controllably reach zero-field conditions. After hydrogenation, the sample is measured within the magnetically shielded chamber 20 by using magnetic field pulse generation means 30 and at least one magnetoresistive sensor 40.

For example, a sample may be measured via the following procedure:

Polarizing, particularly hyperpolarizing, the sample, for example by placing the sample in a pre-polarizing high magnetic field (e.g. placing the sample in a pre-polarizing magnetic field of about 1.8 T for about 20 s) and/or by using other hyperpolarization techniques as described above (preferably a parahydrogen hyperpolarization);

Shuttling the sample into the magnetically shielded chamber 20 or magnetically shielded detection region;

While shuttling the sample, applying a guiding magnetic field using the solenoid 65 wrapped around the shuttling tube 60, as well as the z-axis Helmholtz pulsing coil;

After the sample arrives next to the magnetoresistive sensor 40, adiabatically turning off the solenoid current;

Then, suddenly (e.g. within 10 ms) turning off the x-axis pulse-coil current, resulting in an initial state of nuclear spins; Then, applying a magnetic field pulse (e.g. with a duration of 50 ms) along the x-axis;

Immediately following the pulse, measuring the magnetic signal produced by the sample along the z-axis via the magnetoresistive sensor 40 (e.g. by reading out the analog output of the sensor by using an analog input card).

Within the present invention, the inventors could for the first time realize ZULF-NMR spectroscopy with magnetoresistance (e.g. GMR) detection. In particular, the present invention provides a high bandwidth and can potentially achieve spatial imaging. Further, the present invention can for example be applied with a microfluidic setup. This is because the small intrinsic size of the magnetoresistive sensor particularly matches for this purpose. Moreover, instead of a conventional remote detection, an in-situ detection can be carried out with the present invention.

The present invention works with a broad range of samples including but not limited to the following examples:

[$^{13}$C]methanol, thermally polarized

[$^{13}$C]sodium formate diluted in $D_2O$ (JCH=195 Hz), thermally polarized

[$^{13}$C]formic acid (JCH=222 Hz), thermally polarized

[1-$^{13}$C]fumarate, hyperpolarized by PHIP

In particular, the present invention works with any samples that are suitable for ZULF NMR.

LIST OF REFERENCE NUMERALS

20 magnetically shielded chamber
22 Mu-metal layer (first magnetic shield)
24 ferrite layer (second magnetic shield)
30 system of Helmholtz coils (magnetic field generation means)
40 magnetoresistive sensor
50 sensor holder
60 shuttling tube
65 solenoid
70 pre-polarizing magnet (hyperpolarization means)
72 parahydrogen hyperpolarization means (hyperpolarization means)
100 NMR apparatus

The invention claimed is:

1. An apparatus for investigating a sample by using nuclear magnetic resonance including zero-to ultra-low-field nuclear magnetic resonance, the apparatus comprising:

a magnetically shielded chamber for magnetically shielding the sample from external static magnetic fields;

a magnetic field pulse generation means arranged in the magnetically shielded chamber and configured to manipulate nuclear spins present in the sample, thereby causing the sample to produce a magnetic signal; and at least one magnetoresistive sensor comprising a ferromagnetic material, wherein the at least one magnetoresistive sensor is arranged in the magnetically shielded chamber and configured to detect the magnetic signal produced by the sample.

2. The apparatus according to claim 1, comprising:

a demagnetization means which are configured to demagnetize the at least one magnetoresistive sensor.

3. The apparatus according to claim 2, further comprising:

a measurement sequencing unit for controlling the magnetic field pulse generation means and the demagnetization means, wherein the measurement sequencing unit is configured to carry out a measurement sequence including a demagnetization sequence for demagnetizing the at least one magnetoresistive sensor, wherein the demagnetization sequence comprises the generation and/or application of a decaying sinusoidal wave magnetic field.

4. The apparatus according to claim 1, further comprising:

a sensor holder for holding the at least one magnetoresistive sensor, wherein the sensor holder is arranged in the magnetically shielded chamber and further serves as a support for the magnetic field pulse generation means.

5. The apparatus according to claim 1, further comprising:

a spin hyperpolarization means for hyperpolarizing nuclear spins present in the sample.

6. The apparatus according to claim 5, wherein the spin hyperpolarization means are configured to carry out a parahydrogen induced polarization.

7. The apparatus according to claim 1, wherein the magnetically shielded chamber comprises a first magnetic shield and a second magnet shield, wherein the second magnetic shield comprises a ferrite layer which is arranged between the first magnetic shield and the magnetoresistive sensor.

8. The apparatus according to claim 1, further comprising:

a shuttling tube for shuttling the sample into the magnetically shielded chamber, and a solenoid wrapped around the shuttling tube.

9. The apparatus according to claim 1, further comprising:

a computer-based data acquisition system which is coupled to the at least one magnetoresistive sensor and configured to record a detection signal from the at least one magnetoresistive sensor.

10. A method for investigating a sample by using nuclear magnetic resonance including zero-to ultra-low-field nuclear magnetic resonance, the method comprising:

magnetically shielding the sample from external static magnetic fields by placing the sample into a magnetically shielded chamber;

manipulating nuclear spins that are present in the sample by using magnetic field pulse generation means arranged in the magnetically shielded chamber, thereby causing the sample to produce a magnetic signal; and detecting the magnetic signal produced by the sample by using at least one magnetoresistive sensor which is arranged in the magnetically shielded chamber and which comprises a ferromagnetic material.

11. The method according to claim 10, wherein before detecting the magnetic signal produced by the sample, the at least one magnetoresistive sensor is demagnetized.

12. The method according to claim 11, wherein the magnetoresistive sensor is demagnetized in that a decaying sinusoidal wave magnetic field is generated in the vicinity of the magnetoresistive sensor by using demagnetization.

13. The method according to claim 11, wherein nuclear spins present in the sample are hyperpolarized before manipulating the spins.

14. The method according to claim 13, wherein the hyperpolarization is carried out by using parahydrogen-induced polarization methods.

15. The method according to claim 13, wherein the hyperpolarization of the nuclear spins present in the sample is carried out in-situ inside the magnetically shielded chamber and/or in-situ inside the sample.

* * * * *